United States Patent [19]

Austin

[11] Patent Number: 4,791,323
[45] Date of Patent: Dec. 13, 1988

[54] LEVEL TRANSLATION CIRCUIT

[75] Inventor: Charles C. Austin, El Toro, Calif.

[73] Assignee: Silicon Systems, Inc., Tustin, Calif.

[21] Appl. No.: 922,536

[22] Filed: Oct. 23, 1986

[51] Int. Cl.⁴ .................. H03K 19/092; H03K 17/16; H03K 17/687

[52] U.S. Cl. .................................. 307/475; 307/443; 307/451; 307/576

[58] Field of Search .................. 307/200 B, 264, 443, 307/445, 448, 451, 475, 571, 576

[56] References Cited

U.S. PATENT DOCUMENTS 4,258,272  3/1981  Huang ................................. 307/475
4,612,461  9/1986  Sood .................................... 307/443

Primary Examiner—John S. Heyman
Assistant Examiner—M. R. Wambach
Attorney, Agent, or Firm—Hecker & Harriman

[57] ABSTRACT

A TTL/CMOS interface circuit comprised entirely of CMOS components. An input gain stage comprised of transistors of a single conductivity type is provided whose gain is established by the ratio of the geometric size of the transistors. In the preferred embodiment of the present invention, the input gain stage is comprised of N channel transistors to a void process related mismatches. An inverter stage has a switching threshold set to optimally operate with the output of the input gain stage. The voltage at the inverter stage is tied to the power supply voltage to supply an upper voltage limit. In order to provide for zero power operation for input signals close the value of the supply voltage, a transistor is provided to cut current flow in the input stage for input signals within a threshold voltage of the supply voltage. The present circuit may also be utilized as to allow zero power operation for input signals close to ground.

8 Claims, 1 Drawing Sheet

LEVEL TRANSLATION CIRCUIT

BACKGROUND OF THE PRESENT INVENTION

1. Field of the Invention

This invention relates to the field of voltage level translation circuits and in particular the translation of transistor transistor logic (TTL) signals to complementary metal oxide semiconductor (CMOS) voltage levels.

2. Background Art

It is often desired to provide an interface between CMOS (integrated circuit) devices and TTL circuitry. In providing such an interface, it is necessary to convert the voltage levels of the TTL circutry to levels which may be utilized in the CMOS circuitry.

Previous technology for the interface circuits involved comparator circuits with a reference voltage set for the midpoint of the TTL specification (e.g. 1.3 to 1.4 volts). Other prior art circuitry involved a CMOS inverter stage with transistor sizes selected to optimize the switching threshold near the TTL specification point.

The accuracy of comparator techniques depends upon the accuracy of the reference voltage being used. For example, if a reference voltage is shared among several input buffer circuits, there is a risk of noise coupling on the reference voltage causing interference between inputs. The comparator circuit will consume bias power regardless of the input voltage level, and thus will typically not provide zero power operation for the CMOS to CMOS application. In addition, the comparator circuit is not well suited for high speed operation unless biased at a high power level.

The CMOS inverter circuit is sensitive to process variations as it depends upon the relationship of transistor characteristics between P channel and N channel transistors. The two different devices (P channel and N channel) do not "track" or self compensate in typical wafer fabrication processes. As a result, the switching threshold varies too much to insure proper operation in the typical range of process variations and operating environments.

Further, the size ratio required to shift the inverter threshold from mid power supply down to TTL levels is such that the N channel device dominates the circuit behavior, and any changes in the threshold or conductance of the N channel transistor will shift the switching threshold accordingly.

Therefore, it is an object of the present invention to provide a TTL/CMOS interface circuit which is insensitive to process variations.

It is yet another object of the present invention to provide a TTL/CMOS interface circuit comprised entirely of CMOS components (no diodes or bipolar transistors) which operates at a high rate of speed.

SUMMARY OF THE PRESENT INVENTION

A TTL/CMOS interface circuit comprised entirely of CMOS components. An input gain stage comprised of transistors of a single conductivity type is provided whose gain is established by the ratio of the geometric size of the transistors. In the preferred embodiment of the present invention, the input gain stage is comprised of N channel transistors to avoid process related mismatches. An inverter stage has a switching threshold set to optimally operate with the output of the input gain stage. The voltage at the inverter stage is tied to the power supply voltage to supply an upper voltage limit. In order to provide for zero power operation for input signals close to the value of the supply voltage, a transistor is provided to cut current flow in the input stage for input signals within a threshold voltage of the supply voltage. The present circuit may also be utilized as to allow zero power operation for input signals close to ground.

DETAILED DESCRIPTION OF THE PRESENT INVENTION

Interface circuitry for converting TTL voltage levels to CMOS voltage levels is described. In the following description, numerous specific details are set forth, such as conductivity type, voltage levels, hysteresis levels, etc., in order to provide a more thorough understanding of the present invention. It will be obvious, however, to one skilled in the art, that the present invention may be practiced without these specific details. In other instances, well known circuits have not been described in detail in order not to unnecessarily obscure the present invention.

Figure 1:
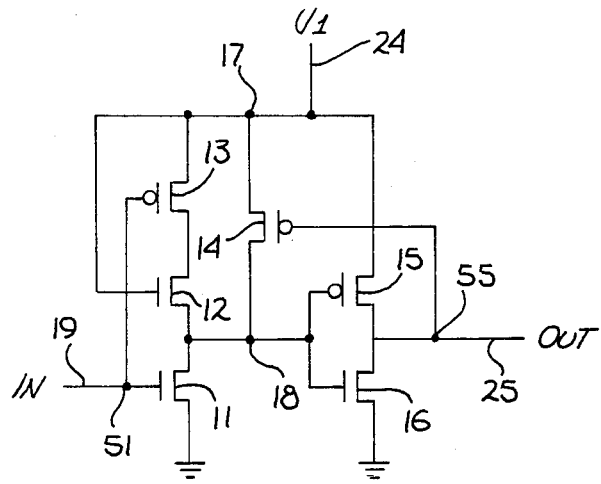
FIG. 1 is a circuit diagram illustrating the preferred embodiment of the present invention for converting TTL voltage levels to 5 volt CMOS levels.

The preferred embodiment of the present invention is illustrated in FIG. 1. The circuit of FIG. 1 is used to convert TTL level voltage signals (e.g. VIL=0.8; VIH=2.0) to 5 volt CMOS voltage levels. The present invention can accomplish this conversion with minimal variation due to process parameter variations. In addition, the circuits described consume no DC power for input voltage levels of VIL=0 volts and VIH=VCC, for low power (CMOS) system applications. The circuits of the present invention are composed entirely of CMOS devices and provide process insensitivity without sacrificing high speed performance.

Referring again to FIG. 1, the circuit of the present invention consists of an input gain stage comprised of N channel transistors 11 and 12. The gate of transistor 11 is coupled to input signal 19 through node 51. Transistor 11 is source coupled to ground and drain coupled to the source of transistor 12. The gain of this input stage is set by the geometric size ratio of transistors 11 and 12. Since both transistors 11 and 12 are N channel transistors, process related mismatches are avoided since any process variations will be self compensating.

The gain of input gain stage comprising transistors 11 and 12 is given by the square root of the ratio of the transconductences of transistors 11 and 12. In the preferred embodiment of the present invention, the gain is set to be approximately 3. A gain of 3 reduces the sensitivity of the circuit to switching threshold variations by the gain factor.

The output of the first inverter gain stage is taken from the source of transistor 12 and drain of transistor 11 and is coupled through node 18 to the second inverter stage. The second inverter stage comprises P channel transistor 15 drain coupled to N channel transistor 16 at node 55. The source of transistor 16 is coupled to ground and the gates of transistors 15 and 16 are coupled to node 18. The output 25 of the circuit is taken from node 55. The switching threshold of this inverter stage is set to optimally operate with the output of the first stage. The output of the first inverter stage at node 18 varies from zero to approximately 3½ to 4 volts, which is less than the supply voltage of 5 volts. In this configuration, in order to set the second inverter stage to optimally operate with the output of the first stage, the second stage is set so that the threshold voltage is approximately ½ the output voltage. Therefore, the size ratios of P transistor 15 and N transistor 16 are set so that the threshold voltage is approximately 1.8 volts.

The gate of transistor 12 of the first inverter stage is coupled to the power supply voltage V1 at node 17. Thus, the voltage at the source of transistor 12 will not rise to a voltage greater than the supply voltage V1 minus a threshold voltage. The threshold voltage is back gate enhanced in the present invention. Therefore, the switching threshold of the second inverter stage is set to a value equal to one half of the supply voltage V1 minus the back-gate-enhanced threshold drop of transistor 22.

It is desired to provide zero power operation for input signals close to the value of V1. To that end, P channel transistor 13 is source coupled to transistor 12 and drain coupled to voltage source V1 at node 17. The gate of P channel transistor 13 is coupled to input signal 19 at node 51. When the input voltage 19 approaches supply voltage V1, transistor 13 turns off, cutting off current flow in the first inverter stage. Transistor 13 is operated as a switch only and is sized to give a transconductance much greater than transistor 22 in order to not affect the operation of the inverter formed by transistors 12 and 11. Thus, the voltage output of the first inverter stage goes to zero volts and eliminates current flow in the second stage by turning off transistor 16 completely.

It is also desired to provide zero power operation for input signals close to ground. Therefore, P channel transistor 14 is provided, drain coupled to node 18 and source coupled to voltage source V1 through node 17. The gate of transistor 14 is coupled to the output signal at node 55. A low input level signal cuts off the current flow through transistor 11. Transistor 12 can only raise the voltage of node 18 to a value of V1 minus a backgate enhanced threshold. However, the voltage output of the first stage is additionally pulled up by transistor 14 to the full value of power supply V1. This cuts off current flow to transistor 15, allowing the second inverter stage to operate in a zero power mode. Transistor 14 provides feedback and can be sized so that the inverter exhibits switching threshold hysteresis for small values of hysteresis.

Figure 2:
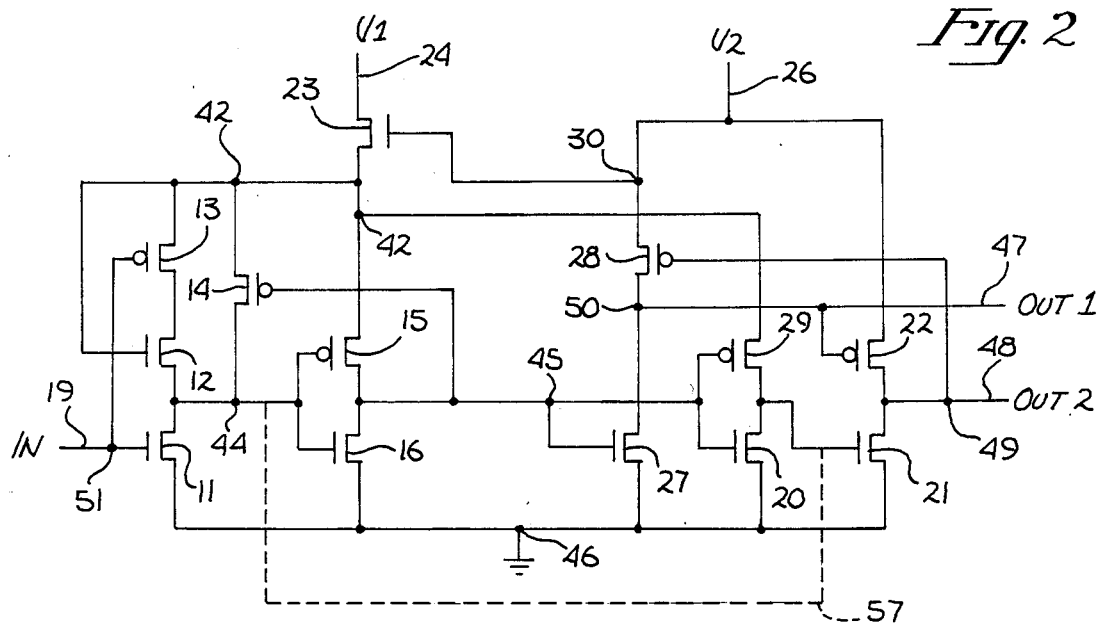
FIG. 2 is a circuit diagram illustrating an alternate embodiment of the present invention used to convert TTL voltage levels to 10 to 12 volt CMOS voltage levels.

Referring to FIG. 2, an alternate embodiment of the present invention is illustrated. This alternate embodiment is used to provide a TTL/CMOS interface for circuits operating with a power supply voltage greater than 8 volts. Such a circuit has particular application in integrated circuits containing both analog and digital circuitry on the same die. The circuit of FIG. 2 contains many of the same elements of FIG. 1 and like elements are identified with like numbers. For example, an input signal 19 is coupled at node 51 to a first inverter gain stage comprising N channel transistors 11 and 12. The output of this first inverter gain stage is coupled to a second gain stage comprising P channel transistor 15 drain coupled to N channel transistor 16. P channel transitors 13 and 14 provide for operation of the circuit at zero power for input signals near the supply voltage V1 and ground respectively. The output of second inverter gain stage is coupled through node 45 to a third inverter gain stage comprising P channel transistor 29 drain coupled to N channel transistor 20. The drain of P channel transistor 29 is coupled at node 42 to the sources of transistors 13 and 14 and the source of N channel transistor 23.

The source of N channel transistor 20 is coupled through node 46 to ground. The output of this third inverter gain stage is taken from the drain of transistors 29 and 20 and is coupled to a fourth gain stage comprising N channel transistor 21 drain coupled to P channel transistor 22.

The source of N channel transistor 21 is coupled to ground. The source of P channel transistor 22 is coupled to a second voltage source V2 at node 30.

Supply voltage V1 is coupled to node 42 through N channel transistor 23 which is source coupled to node 42. The gate of transistor 23 is coupled at node 30 to a second voltage source V2. This second voltage source V2 is also coupled, through P channel transistor 28, to node 50. The gate of transistor 28 is coupled to output out 2 at node 49.

Output 1, OUT1, is taken from node 50, the drain coupled junction of transistors 28 and 27. The gate of transistor 22 is also coupled to output node 50. Finally, the gate of transistor 27 is coupled to the output of the second inverter stage at node 45.

In this alternate embodiment of the present invention, the first voltage reference V1 is approximately 5 volts and the second voltage reference V2 is approximately 10 to 12 volts. Level translation is provided by transistors 27 and 28 and transistors 21 and 22.

N channel transistor 23 removes the connection of P channel transistors 13, 14, 15 and 29 from the power supply V1 when V2 is at too low a value. In multiple power supply situations, power supply sequencing could create a problem. If the present circuit were implemented with a P well process, a current path from voltage source V1 through the P channel transistor source diffusions (or implantations) to the substrate of the integrated circuit could be created when the second supply voltage V2 is too low. Transistor 23 eleminates this current path by turning off at low V2 voltages and isolating voltage source V1 from the P channel transistors 13, 14, 28 and 29, each of which is source coupled to voltage source V1 through transistor 23.

Transistors 21 and 27 have their sizes chosen so that they can switch the state of the level translator with an input voltage which is less than V1 when transistors 28 or 22 have voltage level V2 as a turn-on potential. For example, when input signal 19 is at a level approximating V1, the signal at node 45 is approximately V1. This level turns on transistor 27, pulling node 50 low, turning on P channel transistor 22. This provides a direct path from voltage source V2 to node 49 so that output OUT2 is approximately V2, and transistor 28 is turned completely off. By the same token, output OUT1, taken from node 50, is low.

When the input signal 19 is low, the signal at node 45 (as noted with respect to the description of FIG. 1) is also low. This low signal turns off transistor 27, and turns on P channel transistor 29 so that the output of the converter comprising transistors 20 and 29 has a high signal V1. This turns on transistor 21, pulling node 49 low, resulting in OUT2 being low as well. The low signal at node 49 turns on transistor 28, providing a path between voltage source V2 to node 50 so that output OUT1 is at a level of approximatley V2, turning off transistor 22.

Transistors 27, 28, 21 and 22 form a bistable circuit that does not consume power except during switching. The gate connection of transistors 28 and 22 provide feedback to accomplish the elimination of direct current paths from V2 to ground in the steady state condition. For example, when transistor 27 is on, transistor 28 is off, eliminating the path to ground. Likewise, when transistor 21 is on, transistor 22 is off, eliminating that path to ground.

The alternate embodiment illustrated in FIG. 2 may also be operated without transistors 20 and 29 by making the connection shown by dashed line 57.

Figure 3:
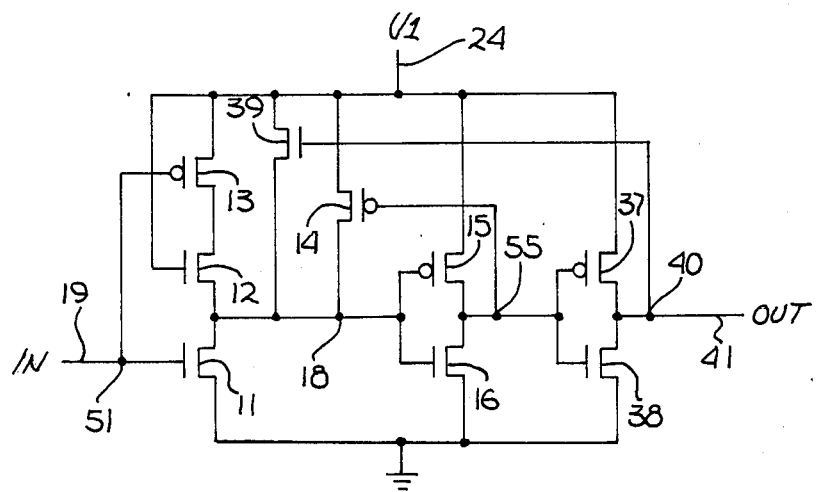
FIG. 3 is a circuit diagram illustrating an alternate embodiment of the present invention used to convert TTL voltage levels to 5 volt CMOS levels with hysteresis input thresholds.

An alternate embodiment of the present invention which provides input switching levels with large hysteresis is illustrated in FIG. 3. The circuit provides switching levels having approximately 0.4 volt hysteresis. The circuit is configured as was described with respect to FIG. 1 with transistors 11 and 12 forming a first inverter gain stage whose output is coupled to a second inverter gain stage comprising transistors 15 and 16. Transistors 13 and 14 provide for zero power operation of the circuit for signals at voltage level V1 and ground respectively.

Added to the circuit of FIG. 3 are N channel transistors 38 and 39 and P channel transistor 37. Transistor 39 is drain coupled to input voltage V2 through node 52 and source coupled to the output of the first inverter stage at node 18.

Transistors 37 and 38 form a third inverter stage. The gates of transistors 37 and 38 are coupled to the output of the second inverter stage. P channel transistor 37 is drain coupled to N channel transistor 38. The source of transistor 38 is coupled to ground at node 54. The source of P channel transistor 37 is coupled to voltage source V1 at node 52. The output of this third inverter stage is taken at the drain coupling of transistors 37 and 38 at node 40. The output 40 is coupled in a feedback manner to the gate of N channel transistor 39.

For input signals having a transition from a low logic level to a high logic level, transistor 11 must operate in ratio with transistors 12 and 39. Transistor 39 is effectively operating in parallel with transistor 12 because of the inverter formed by transistors 37 and 38.

The parallel operation of transistors 12 and 39 continues until the input voltage is such that transistor 11 pulls down the output of the first stage an amount sufficient to cause the inverter formed by transistors 15 and 16 to go high at the output at node 55. A high output at node 55 causes the inverter formed by transistors 37 and 38 to go low, turning off transistor 39 and removing it as a current source, providing positive feedback.

When the input voltage level 19 goes from a high logic level to a low logic level, transistor 11 works in relation to transistor 12 only. Therefore, the input voltage must go to a low value before the output of the first stage at node 18 begins to rise. When the input stage begins to change to a high logic level, feedback from the inverter formed by transistors 15 and 16 and the inverter formed by transistors 37 and 38 turns on transistor 39. This provides a path for voltage source V1 causing the output of the first stage at node 18 to rise. Thus, the input switching thresholds are set by the relationship of transistors 11 to 12 in parallel with transistor 39 for positive input transistions (i.e. low to high) and the ratio of transistor 11 to transistor 12 for negative transitions (i.e. high to low).

Thus, an inter face circuit for effectively converting TTL voltage levels to CMOS voltage levels has been described.

I claim:

1. An electrical circuit for converting transistor transistor logic (TTL) voltages levels to complimentary metal oxide semiconductor (CMOS) voltage levels comprising:
   a first gain stage comprising first and second transistors of a first conductivity type serially connected at a first output node;
   a second gain stage comprising a third transistor of a second conductivity type coupled in series with a fourth transistor of said first conductivity type, said second gain stage coupled to the output node of said first stage;
   a fifth transistor of said second conductivity type coupled in series between a reference voltage and said first gain stage, said fifth transistor for enabling operation of said circuit in a low power mode when an input signal to said first gain stage approaches said reference voltage, said first and fifth transistor being gate coupled to said input signal, said second transistor gate coupled to said reference voltage;
   a sixth transistor of said second conductivity type coupled in series with said voltage reference and said output node of said first gain stage and in a feedback loop to said second gain stage, said sixth transistor for enabling said circuit to operate in a no power mode when said input signal approaches ground potential.

2. The circuit of claim 1 wherein first conductivity type is N type.

3. The circuit of claim 1 further including:
   a seventh transistor of said first conductivity type coupled in series between said output of said first gain stage and said reference voltage;
   a third gain stage comprising an eighth transistor of said second conductivity type and a ninth transistor of said first conductivity type coupled in series with said voltage reference, said third gain stage having an output coupled in a feedback loop to a gate of said seventh transistor;
   said third gain stage and said ninth transistor for enabling said circuit to provide input switching levels having hysteresis.

4. An electrical circuit for connecting transistor logic (TTL) voltage levels to complimentary metal oxide semiconductor (CMOS) comprising:
   a first reference voltage coupled to a first node;
   a first transistor coupled in series between said first node and a fourth transistor;
   a second transistor coupled to a series between said first node and a second node;
   a third transistor coupled in series between said first node and a sixth transistor;
   said fourth transistor coupled in series with said first transistor and gate coupled to said first node;
   a fifth transistor coupled in series with said fourth transistor at said second node, said second transistor coupled to said second node, said first and fifth transistor gate coupled to an input signal;

said sixth transistor coupled in series with said third transistor at a third node, said third and sixth transistors gate coupled to said second node;

said second transistor gate coupled to said third node;

said first second and third transistors of a first conductivity type.

5. The circuit of claim 4 further including a seventh transistor coupled between said first and second nodes;

an eighth transistor coupled between said first node and a fourth node to a ninth transistor, said eighth and ninth transistors gate coupled to said third node;

said seventh transistor gate coupled to said fourth node;

said eighth transistor of said first conductivity type.

6. The circuit of claim 5 wherein said first conductivity type is P type.

7. The circuit of claim 4 further including:

a second reference voltage coupled to a fourth node;

a seventh transistor coupled in series between said first node and said first reference voltage, said seventh transistor gate coupled to said fourth node;

an eighth transistor coupled in series with said fourth node and at a fifth node to a ninth transistor, said ninth transistor gate coupled to said third node;

a tenth transistor coupled in series with said first node an at a sixth node to an eleventh transistor, said tenth and eleventh transistors gate coupled to said third node;

a twelfth transistor coupled in series with said fourth node and at a seventh node to a thirteenth transistor, said twelfth transistor gate coupled to said fifth node, said thirteenth transistor gate coupled to said sixth node;

said eight transistor gate coupled to said seventh node;

said eighth, tenth, and twelfth transistors of said first conductivity type;

said second reference voltage higher than said first reference voltage.

8. The circuit of claim 7 wherein said first conductivity is P type.

* * * * *